United States Patent [19]

Taniguchi et al.

[11] 4,290,109
[45] Sep. 15, 1981

[54] ELECTRIC MONITORING METHOD AND APPARATUS FOR ELECTRIC SYSTEM OF AUTOMOTIVE VEHICLE

[75] Inventors: Koichi Taniguchi, Chita; Minoru Katayama, Toyohashi; Osamu Sangu, Toyota; Shinichi Hori, Kariya, all of Japan

[73] Assignee: Nippondenso Co., Ltd., Kariya, Japan

[21] Appl. No.: 26,167

[22] Filed: Apr. 2, 1979

[30] Foreign Application Priority Data

Apr. 10, 1978 [JP] Japan .................. 53-42466

[51] Int. Cl.³ ............................. G08B 21/00
[52] U.S. Cl. ................... 364/481; 364/483; 324/429; 324/433; 320/32; 340/636
[58] Field of Search ............... 364/481, 483; 235/92 EL, 92 MT; 340/636, 662, 663; 320/48, 32; 324/29.5, 39, 427, 429, 430, 433, 434, 428

[56] References Cited

U.S. PATENT DOCUMENTS

| | | | |
|---|---|---|---|
| 3,852,732 | 12/1974 | Yorksie et al. | 340/636 |
| 3,940,679 | 2/1976 | Brandwein et al. | 320/48 |
| 3,991,357 | 11/1976 | Kaminski | 320/32 |
| 4,017,724 | 4/1977 | Finger | 340/636 |
| 4,021,718 | 5/1977 | Konard | 340/636 |
| 4,025,916 | 5/1977 | Arnold et al. | 320/48 |
| 4,028,616 | 6/1977 | Stevens | 324/29.5 |
| 4,044,300 | 8/1977 | Dupuis et al. | 320/48 |
| 4,065,712 | 12/1977 | Godard et al. | 320/39 |
| 4,146,830 | 3/1979 | Foster | 320/39 |
| 4,153,867 | 5/1979 | Jungfer et al. | 320/48 |
| 4,194,146 | 3/1980 | Patry et al. | 320/48 |

FOREIGN PATENT DOCUMENTS

| | | |
|---|---|---|
| 2500332 | 7/1975 | Fed. Rep. of Germany. |
| 2730258 | 1/1978 | Fed. Rep. of Germany. |
| 1400391 | 7/1975 | United Kingdom. |

Primary Examiner—Mark E. Nusbaum
Assistant Examiner—Gary Chin
Attorney, Agent, or Firm—Cushman, Darby & Cushman

[57] ABSTRACT

In an electric monitoring method and apparatus for a secondary battery, a computer is utilized to monitor abnormal phenomena of a terminal voltage across the battery in relation to a load current flowing from the battery to an electric load circuit.

14 Claims, 5 Drawing Figures

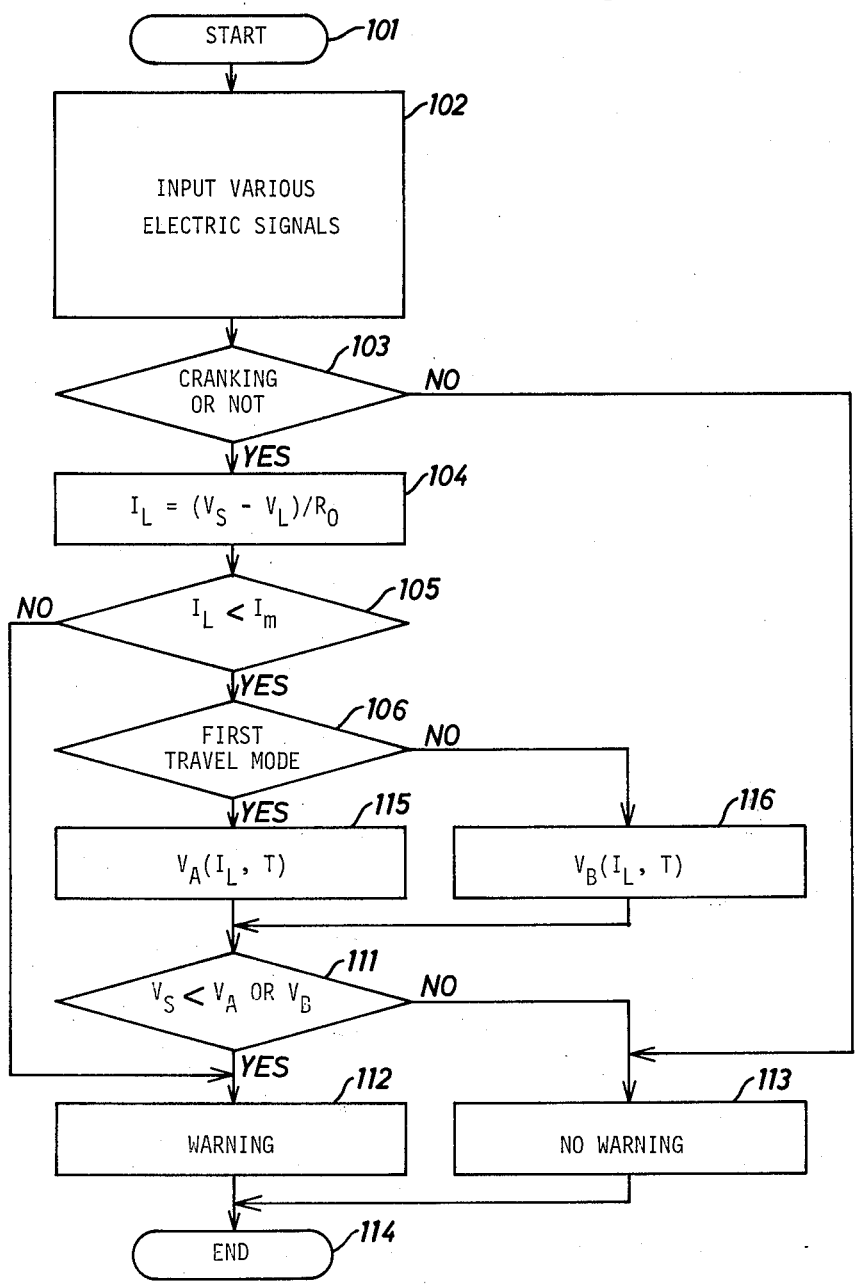

4,290,109

ELECTRIC MONITORING METHOD AND APPARATUS FOR ELECTRIC SYSTEM OF AUTOMOTIVE VEHICLE

BACKGROUND OF THE INVENTION

The present invention relates to an electric monitoring method and apparatus for an electric system of an automotive vehicle in which an electric source in the form of a secondary battery is provided to supply a load current to an electric load circuit.

During use of the secondary battery, it is observed that the instantaneous terminal voltage across the battery decreases in accordance with increase of the load current under normal conditions. If the terminal voltage across the battery is extraordinarily decreased due to malfunctions of the load circuit, an alternator associated with the battery or the like, the life of battery is shortened. It is, therefore, desirable to monitor for an extraordinary decrease of the terminal voltage so as to hold the life of battery as long as possible.

SUMMARY OF THE INVENTION

It is a primary object of the present invention to provide an electric monitoring method and apparatus in which a computer is utilized to monitor abnormal phenomena of the terminal voltage across the battery in relation to a load current.

It is another object of the present invention to provide an electric monitoring method and apparatus, having in the above-noted characteristics, in which the abnormal phenomena of the battery is monitored by the computer in consideration with an ambient temperature around the battery.

It is still another object of the present invention to provide an electric monitoring method and apparatus, having in the above-noted characteristics, in which the abnormal phenomena of the battery is monitored by the computer in consideration with travel modes of the vehicle.

In a preferred embodiment of the present invention, there is provided an electric monitoring apparatus for a use with a secondary energy source connected to an alternator driven by the primary engine of a vehicle and to an electric load circuit through a conductor.

The invention includes a first detector to detect the instantaneous terminal voltage across the battery, to produce a first electric signal indicative of the instantaneous terminal voltage. Also, a second detector detects the instantaneous terminal voltage across the load circuit, the second detector producing a second electric signal indicative of the instantaneous terminal voltage across the load circuit.

To derive a reference value indicative of a reference terminal voltage in accordance with the second electric signal, a computer repetitively obtains the reference value from a function defining a desired relationship between the reference terminal voltage and a normal load current corresponding with the terminal voltage across the load circuit, the reference value is representative of a minimum performance for normal functioning of the circuit including the energy source, alternator, conductor and load circuit. The computer also produces an output signal when a value defined by the first electric signal is lower than the reference value. A warning signal is responsive to the output signal from the computer to warn of the occurrence of an excessive drop of the instantaneous terminal voltage.

BRIEF DESCRIPTION OF THE DRAWINGS

Additional objects and advantages of the present invention will be more readily apparent from the following detailed description of preferred embodiments thereof when taken together with the accompanying drawings in which:

FIG. 5 is a modification of the flow diagram of FIG. 2.

DESCRIPTION OF THE PREFERRED EMBODIMENTS

Figure 1:
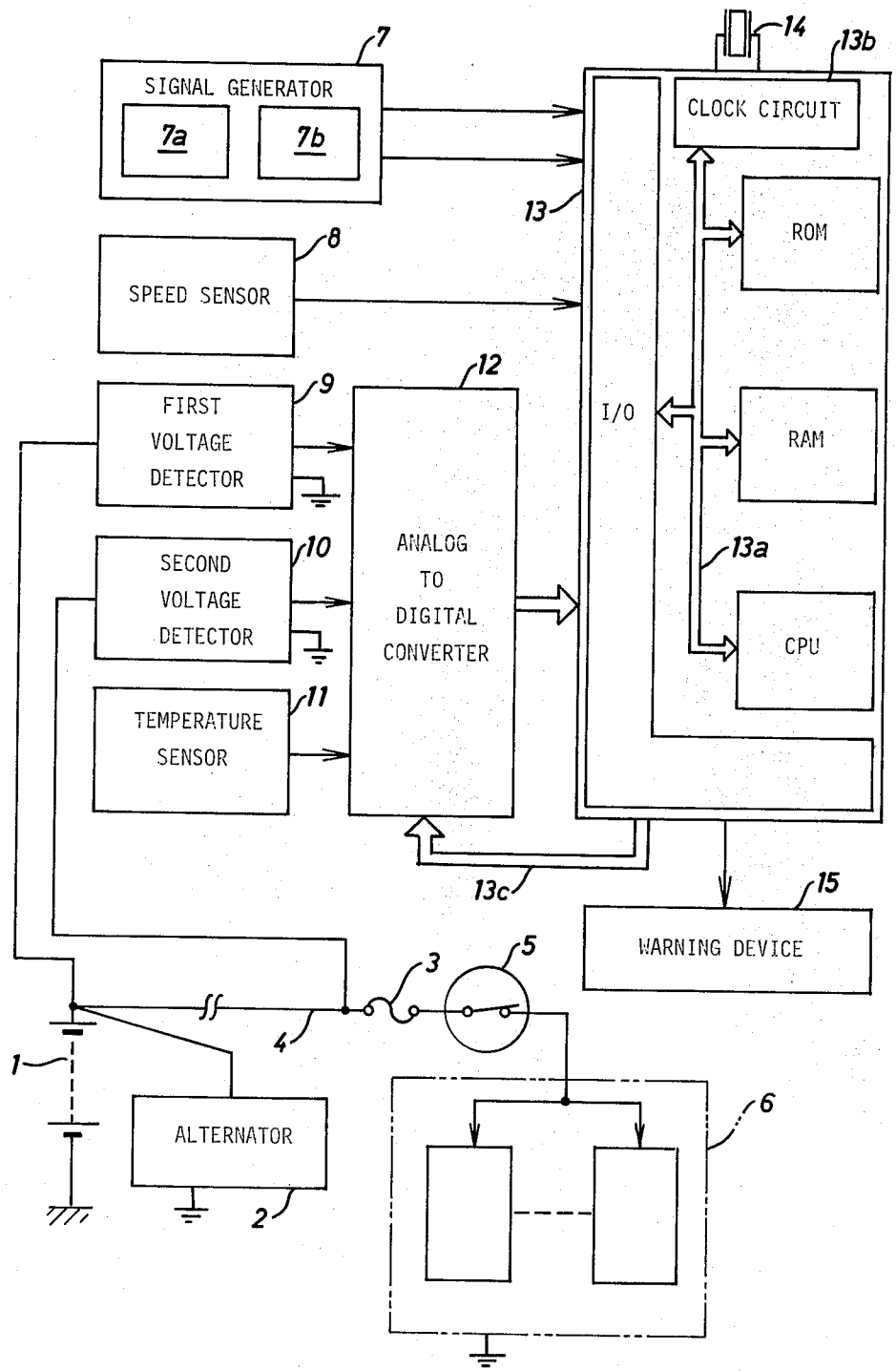
FIG. 1 illustrates a schematic block diagram of an electric monitoring apparatus in accordance with the present invention.

Referring now to FIG. 1 of the drawings, there is illustrated a schematic block diagram of an electric monitoring apparatus for an electric system of an automotive vehicle in accordance with the present invention. A vehicle battery 1 has a positive terminal connected to a charger such as an alternator 2 and a negative terminal grounded. The positive terminal of battery 1 is also connected to an electric load circuit 6 through a conductor 4, a fuse 3 and a manually operable switch 5 in the form of an ignition switch for the vehicle. The alternator 2 is driven by an internal combustion engine of the vehicle to charge the vehicle battery 1. The conductor 4 has a predetermined resistance value $R_0$, and the fuse 3 is located adjacent to the ignition switch 5. The fuse 3 is melted due to an excessive current flowing therethrough to disconnect the conductor 4 from the ignition switch 5. The ignition switch 5 is manually closed to feed an electric load current $I_L$ from battery 1 to the load circuit 6 through the conductor 4 and fuse 3. The load circuit 6 includes various electric equipments adapted to the vehicle, each of the equipments being connected to the ignition switch 5 through each manual switch (not shown). Thus, each of the electric equipments is activated upon closure of each manual switch by the electric current $I_L$ through the ignition switch 5.

The electric monitoring apparatus comprises a travel mode signal generator 7 and a rotational speed sensor 8. The travel mode signal generator 7 is provided adjacent to an operator's seat within the vehicle and comprises first and second push button switches 7a, 7b. The first push button switch 7a is manually closed under a first travel mode of the vehicle to generate a first signal indicative of the first travel mode from the signal generator 7. The first travel mode of the vehicle means a travel mode in a place where automotive service-stations may be easily found. The second push button switch 7b is also manually closed under a second travel mode of the vehicle to generate a second signal indicative of the second travel mode from the signal generator 7. The second travel mode means a travel mode in night-time or in a place where any service-station may not be easily found. The first and second signals are respectively applied to a digital computer 13. The speed sensor 8 is provided on a portion of the engine to detect rotational speed of the engine. When the rotational speed exceeds a predetermined value corresponding to completion of cranking of the engine, the speed sensor 8 generates an output signal therefrom.

The monitoring apparatus further comprises a first voltage detector 9 connected to the battery 1 and a second voltage detector 10 connected to the load circuit 6 through the fuse 3 and ignition switch 5. The first voltage detector 9 acts to detect an instantaneous terminal voltage $V_S$ across battery 1 to produce an output signal indicative of the terminal voltage $V_S$. The second voltage detector 10 acts to detect a terminal voltage $V_L$ across the electric load circuit 6 to produce an output signal indicative of the terminal voltage $V_L$. A temperature sensor 11 is located near the battery 1 to detect an ambient temperature T around the battery 1, the sensor 11 producing an output signal indicative of the ambient temperature T. The output signals from the detectors 9, 10 and sensor 11 are respectively applied to and converted by an analog-to-digital converter 12 into binary signals. Each of the binary signals is applied to the computer 13 in response to a control signal issued from the computer 13 through a control bus 13c.

The digital computer 13 is a single chip LSI microcomputer and comprises a central processing unit or CPU which is connected to an input-output device or I/O through a data bus 13a. CPU is also connected through the data bus 13a to a clock circuit 13b, a read only memory or ROM, and a random access memory or RAM. I/O receives binary signals from converter 12 and output signals from signal generator 7 and speed sensor 8 to temporarily memorize them in RAM. The memorized signals in RAM are selectively read out and applied by I/O to CPU through data bus 13a. I/O has a latch circuit which serves to latch therein an output signal from CPU. A program is previously stored in ROM such that CPU calculates the load current $I_L$ from the following function (1) and discriminates whether or not the load current $I_L$ is larger than a maximum allowable current $I_m$ flowing through the conductor 4.

$$I_L = (V_S - V_L)/R_0 \qquad (1)$$

The maximum allowable current $I_m$ is determined experimentally and memorized in ROM together with the resistance value $R_0$ of conductor 4 by means of the program.

Figure 4:
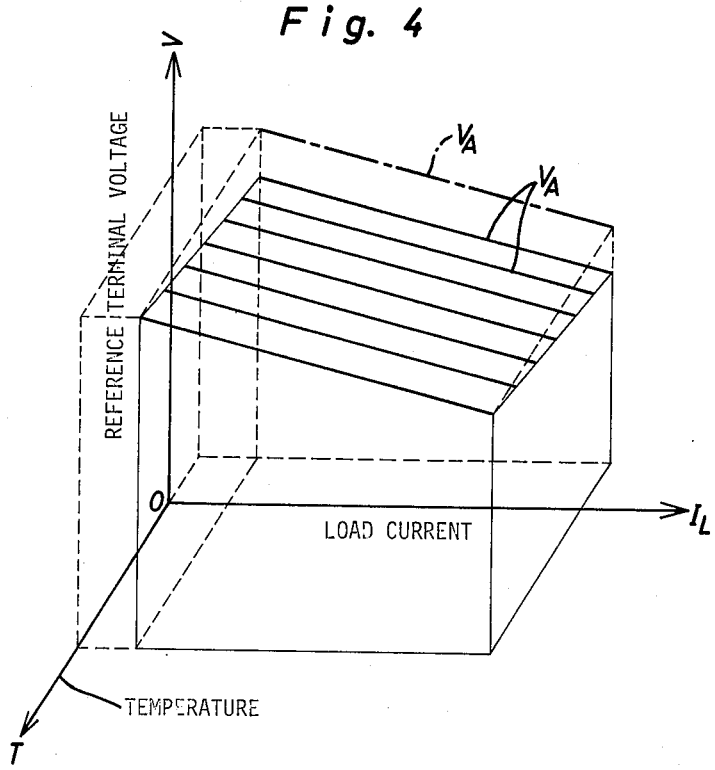
FIG. 4 is a graph of the terminal voltage in relation to the load current in consideration with ambient temperature.

The program is also previously stored in ROM such that CPU selectively calculates first and second reference terminal voltages $V_A$, $V_B$ across battery 1 from the following first and second linear functions (2), (3) and discriminates whether or not the instantaneous terminal voltage $V_S$ is higher than the first and second reference terminal voltage $V_A$, $V_B$ respectively:

$$V_A = aI_L + V_1(T) \qquad (2)$$

$$V_B = aI_L + V_2(T) \qquad (3)$$

where the character a is a negative constant indicative of a slope of the respective functions (2), (3), and where the characters $V_1(T)$, $V_2(T)$ are respectively ordinate intercepts of the functions (2), (3) in consideration with the ambient temperature T around the battery 1. The linear function (2) is obtained from each linear line which indicates a desired relationship between the first reference terminal voltage $V_A$ and the load current $I_L$ in consideration with the ambient temperature T, as shown in FIG. 4. In FIG. 4, a dot-dash line indicates drop of the first reference voltage $V_A$ in relation to increase of the load current $I_L$, and solid lines indicate drop of the first reference voltage $V_A$ in relation to increase of the load current $I_L$ in consideration with drop of the ambient temperature T.

Figure 3:
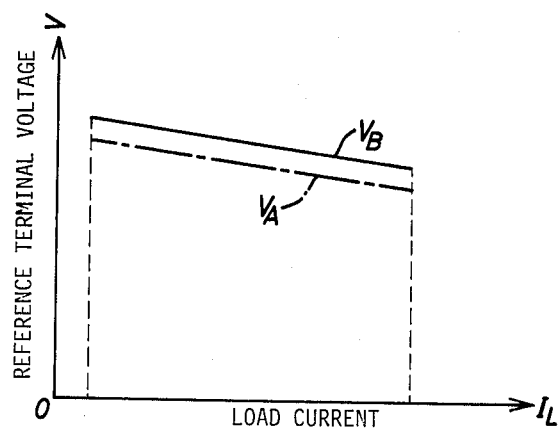
FIG. 3 is a graph of a terminal voltage across the battery in relation to an electric load current flowing out from the battery.

The linear function (3) is also obtained from each line which indicates another desired relationship between the second reference terminal voltage $V_B$ and the load current $I_L$ in consideration with the ambient temperature T. These relationships are respectively obtained experimentally, and the reference terminal voltages $V_A$, $V_B$ are respectively determined to be higher than a critical terminal voltage across the battery 1 caused by continuous supply of an excessive load current from the battery 1 to the load circuit 6. The excessive current is defined as a critical load current in a condition wherein electric charge energy to battery 1 is shorter than electric discharge energy from battery 1 due to malfunctions of alternator 2, load circuit 6 and the like. In this case, the second reference terminal voltage $V_B$ is determined to be higher than the first reference terminal voltage $V_A$ by a predetermined voltage, for example one volt, as shown in FIG. 3. To calculate the linear functions (2), (3) in CPU, ROM previously stores therein the negative constant a and a plurality of ordinate intercepts defined by the linear function (2) in consideration with ambient temperature T. ROM also stores therein a plurality of ordinate intercepts defined by the linear function (3) in consideration with ambient temperature T.

The clock circuit 13b is cooperable with a crystal oscillator 14 to generate clock signals at a predetermined frequency. The computer 13 is connected to a voltage stabilizer (not shown) which is connected through the ignition switch 5 to battery 1. When the ignition switch 5 is closed, the stabilizer produces a constant voltage of five volts for starting execution in computer 13. CPU calculates the load current $I_L$ by means of the program by using binary signals from RAM and discriminates whether or not the load current $I_L$ is larger than the maximum allowable current $I_m$ from ROM. When the load current $I_L$ is larger than the maximum allowable current $I_m$, CPU produces an output signal therefrom. CPU also selectively calculates the first and second reference terminal voltages $V_A$, $V_B$ by means of the program by using the above-noted stored data in ROM and subsequently discriminates whether or not the instantaneous terminal voltage $V_S$ of the binary signal from RAM is higher than the terminal voltages $V_A$ and $V_B$ respectively. When the terminal voltage $V_S$ is lower than the reference terminal voltage $V_A$ or $V_B$, CPU produces an output signal therefrom. In practice of the present invention, a microcomputer of 8048 type manufactured by INTEL CORP. has been used as the computer 13 due to its commercial availability. Detail description regarding the microcomputer is eliminated because the particular construction and programming process is well known in prior arts. In the monitoring apparatus, a warning device 15 is provided to receive the output signal from the latch circuit of I/O and produce a warning signal therefrom.

Hereinafter, various operational modes of the electric monitoring apparatus will be described in detail with reference to a flow diagram of the computer program shown in FIG. 2. When the ignition switch 5 is actuated to start the vehicle, a terminal voltage $V_S$ from battery 1 is applied to computer 13 through the stabilizer and is also applied to load circuit 6 through the conductor 4 and fuse 3 to crank the engine. Thus, the computer program is initiated at a point 101 and proceeds to a point 102.

When the terminal voltage $V_S$ across battery 1 is detected by the first voltage detector 9, an output signal indicative of the terminal voltage $V_S$ is applied to the analog-to-digital converter 12. A terminal voltage $V_L$ across the load circuit 6 is also detected by the second voltage detector 10 and is applied to the converter 12 as an output signal indicative of the terminal voltage $V_L$. Further, an ambient temperature T around battery 1 is detected by the temperature sensor 11 and is applied to the converter 12 as an output signal indicative of the ambient temperature T. These output signals are respectively converted by the converter 12 and then applied to computer 13 as binary signals. In this stage, the speed sensor 8 does not produce any output signals in cranking of the engine.

When the computer 13 receives the binary signals from converter 12, the binary signals are temporarily memorized in RAM, and the computer program proceeds to a point 103. Then, CPU discriminates as "no" to proceed the program to points 113, 114. As a result, any output signal does not appear from computer 13, and the warning device 15 does not produce a warning signal therefrom. Thus, it will be understood that under cranking of the engine, the above-noted execution in computer 13 is repeated at a predetermined time interval to disable warning operation of the monitoring apparatus. The operator is released from a warning of the monitoring apparatus which is caused by the transient terminal voltage drop of battery 1 under cranking of the engine.

When the first push button switch 7a of signal generator 7 is actuated in idling operation of the engine during the above-noted repetitive execution of computer 13, output signals are produced from signal generator 7 and speed sensor 8 and temporarily memorized in RAM at point 102 together with binary signals from converter 12. Then, at point 103, CPU discriminates as "yes" to proceed the computer program to a point 104. At point 104, the binary signals respectively indicative of the terminal voltages $V_S$, $V_L$ are read out from RAM, and the predetermined resistance value $R_0$ is also read out from ROM. Then, an electric load current $I_L$ flowing through the conductor 4 is calculated by CPU from the function (1) in relation to the read out values $V_S$, $V_L$, $R_0$. When the program proceeds to a point 105, the maximum allowable current $I_m$ is read out from ROM, and CPU discriminates as to whether or not the load current $I_L$ is larger than the maximum current $I_m$. If the load current $I_L$ is larger than the current $I_m$, the discrimination of CPU results in "no", the computer program proceeding to a point 112. This means that malfunction such as a short circuit is formed in the load circuit 6. Then, CPU produces an output signal which is applied to the latch circuit of I/O. Thus, the warning device 15 produces a warning signal therefrom in response to the output signal from the latch circuit.

If the load current $I_L$ is smaller than the maximum current $I_m$, the discrimination of CPU results in "yes", and the program proceeds to a point 106. When the first signal of signal generator 7 is read out from RAM at point 106, CPU discriminates the vehicle is under the first travel mode, the program proceeding to a point 107. Then, the binary signal indicative of the ambient temperature T is read out from RAM, and an ordinate intercept $V_1(T)$ is read out from ROM in relation to the ambient temperature T. Thereafter, the ordinate intercept $V_1(T)$ is temporarily memorized in RAM, and the computer program proceeds to a following point 108. At this point 108, the load current $I_L$ and ordinate intercept $V_1(T)$ are read out from RAM, and the negative constant a is read out from ROM. When a first reference voltage $V_A$ is calculated by CPU from the linear function (2) in relation to the values $I_L$, $V_1(T)$, a, it is temporarily stored in RAM, and the program proceeds to a point 111. Then, the first reference voltage $V_A$ and terminal voltage $V_S$ are read out from RAM, and CPU discriminates as to whether the terminal voltage $V_S$ is higher the first reference voltage $V_A$ or not.

If the terminal voltage $V_S$ is higher than the first reference terminal voltage $V_A$, the discrimination of CPU results in "no", the program proceeding to point 113. Thus, any output signal does not appear from computer 13, and the warning device 15 does not produce a warning signal therefrom. As a result, it will be understood that the above-noted execution in computer 13 is repeated at the predetermined time interval to maintain the discrimination of CPU as "no" till the terminal voltage $V_S$ drops below the first reference voltage $V_A$.

If the instantaneous terminal voltage $V_S$ is lower than the reference terminal voltage $V_A$ due to malfunction of the alternator 2, the discrimination of CPU results in "yes", the program proceeding to a point 112. Then, an output signal is produced by CPU and is latched by I/O. Thus, the warning device 15 receives the latched output signal from I/O to generate a warning signal therefrom. This indicates malfunction of the electric system.

In case the second push button switch 7b of signal generator 7 is actuated under the second travel mode, a second signal is generated from the signal generator 7 and is applied to computer 13 together with an output signal from speed sensor 8. Simultaneously, output signals from the detectors 9, 10 and sensor 11 are respectively converted by converter 12 and are applied to computer 13 as binary signals. When the computer program proceeds from point 101 to point 106, as previously described, the second signal of signal generator 7 is read out from RAM, and CPU discriminates the fact that the vehicle is under the second travel mode, the program proceeding to a point 109. Then, the binary signal indicative of the ambient temperature T is read out from RAM, and an ordinate intercept $V_2(T)$ is read out from ROM by using the stored data in relation to the ambient temperature T. When the program proceeds to a point 110, a second reference voltage $V_B$ is calculated by CPU from the linear function (3) in relation to the values $I_L$, $V_s(T)$ and a. The calculated second reference voltage $V_B$ is temporarily stored in RAM, and the program proceeds to point 111. At this point 111, the second reference voltage $V_B$ and instantaneous terminal voltage $V_S$ are read out from RAM, and CPU discriminates as to whether the terminal voltage $V_S$ is lower than the second reference voltage $V_B$ or not.

If the instantaneous terminal voltage $V_S$ is higher than the second reference voltage $V_B$, the discrimination of CPU results in "no", the program proceeding to point 113. Thus, any output signal does not appear from computer 13, and the warning device 15 does not produce a warning signal therefrom. As a result, it will be understood that the above-noted execution in computer 13 is repeated to maintain the discrimination as "no" till the terminal voltage $V_S$ drops below the second reference voltage $V_B$.

If the instantaneous terminal voltage $V_S$ is lower than the second reference voltage $V_B$ due to malfunction of the alternator 2, the discrimination of CPU results in "yes", the program proceeding to point 112. Then, an output signal is produced by computer 13, and the warning device 15 receives the output signal from computer 13 to generate a warning signal therefrom. This indicates malfunction of the electric system.

From the above description, it will be understood that malfunction of the electric system under the second travel mode is informed in time earlier than that under the first travel mode due to difference between the reference voltages $V_A$, $V_B$. As a result, the monitoring apparatus is more available since any service-station may not be easily found under the second travel mode.

Figure 2:
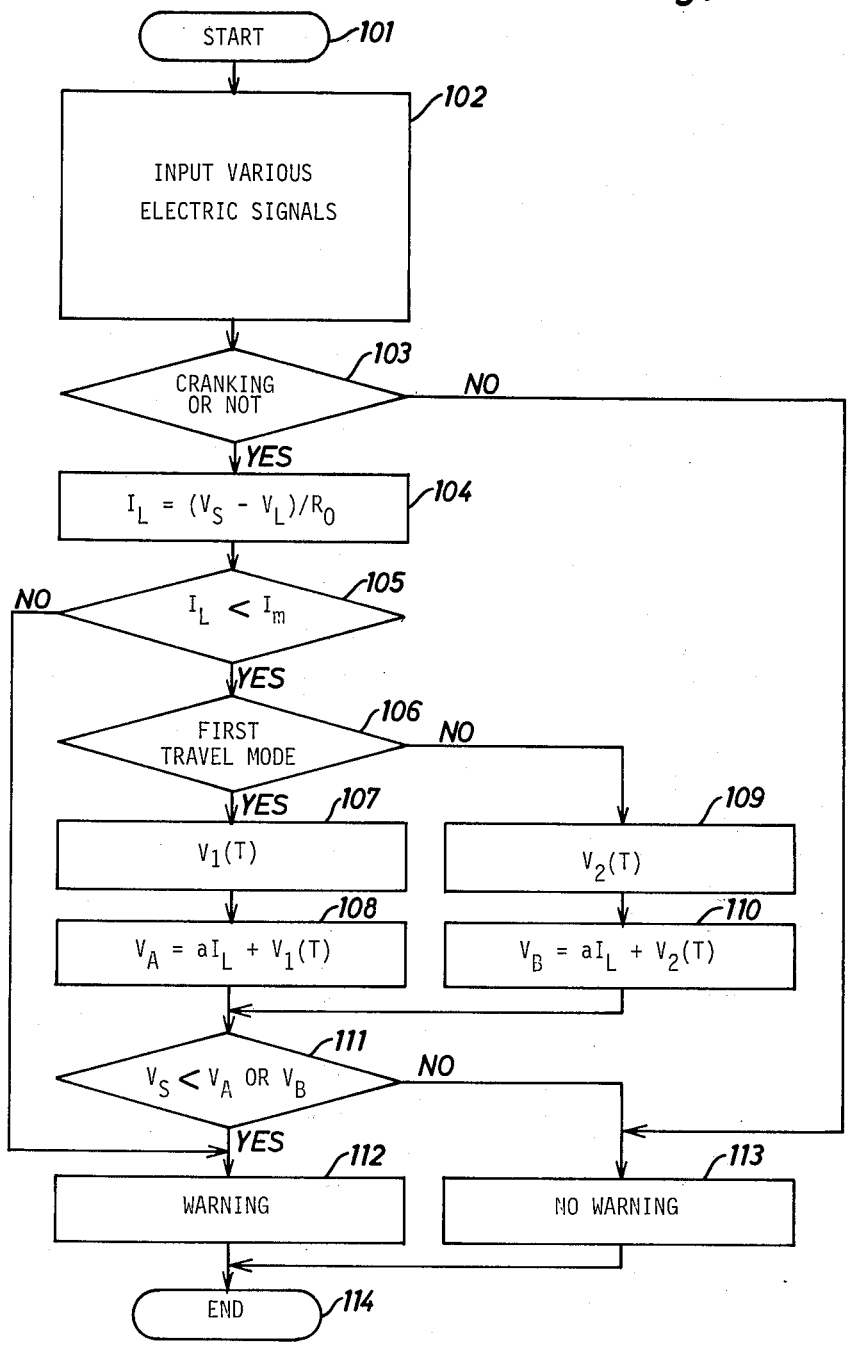
FIG. 2 is a flow diagram illustrating the programming of the digital computer shown in FIG. 1.

FIG. 5 illustrates a modification of the flow diagram shown in FIG. 2. To perform execution in computer 13 according to the flow diagram of FIG. 5, the stored program in ROM in the previous embodiment is modified such that CPU obtains a reference terminal voltage $V_A(I_L, T)$ from a first data in the form of a map indicating the relationship shown in FIG. 4 and also obtains another reference terminal voltage $V_B(I_L, T)$ from a second date in the form of another map which indicates the relationship between another reference terminal voltage $V_B(I_L, T)$ and the load current $I_L$ in consideration with an ambient temperature T. The first and second data are previously stored in ROM in replacement of the ordinate intercepts $V_1(T)$, $V_2(T)$ and negative constant a of the previous embodiment. In this case, the reference voltages $V_A(I_L, T)$, $V_B(I_L, T)$ correspond respectively to the reference voltages $V_A$, $V_B$ of the previous embodiment.

In the modification, operational modes are characterized by the followings with reference to the flow diagram of FIG. 5. After the computer program proceeds to point 106 under the first travel mode, CPU discriminates the vehicle is under the first travel mode, as previously described, and the program proceeds to a following step 115. Then, binary signals respectively indicative of an ambient temperature T and a load current $I_L$ are read out from RAM, and a reference voltage $V_A(I_L, T)$ is read out from ROM in relation to the read out ambient temperature T and load current $I_L$. Thereafter, the program proceeds to point 111, and an instantaneous terminal voltage $V_S$ is read out from RAM to be discriminated by CPU in relation to the reference voltage $V_A(I_L, T)$.

In case the computer program proceeds to point 106 under the second travel mode, CPU discriminates the vehicle is under the second travel mode, as previously described, and the program proceeds to a following step 116. Then, binary signals respectively indicative of an ambient temperature T and a load current $I_L$ are read out from RAM, and another reference voltage $V_B(I_L, T)$ is read out from ROM in relation to the read out values T, $I_L$. Thereafter, the program proceeds to point 111, and an instantaneous terminal voltage $V_S$ is read out from RAM to be discriminated by CPU in relation to another reference voltage $V_B(I_L, T)$.

Having now fully set forth both structure and operation of preferred embodiments of the concept underlying the present invention, various other embodiments as well as certain variations and modifications of the embodiments herein shown and described will obviously occur to those skilled in the art upon becoming familiar with said underlying concept. It is to be understood, therefore, that within the scope of the appended claims, the invention may be practiced otherwise than as specifically set forth herein.

What is claimed is:

1. Monitoring apparatus for use with a secondary energy source connected to an alternator driven by the prime engine of a vehicle and to an electric load circuit through a conductor, said apparatus comprising:
   first detecting means for generating a first signal related to the instantaneous terminal voltage across said energy source;
   second detecting means for generating a second signal related to the instantaneous terminal voltage across said load circuit;
   means responsive to said first and second electric signals for calculating a load current flowing through said load circuit using a resistance value of said conductor and the difference between said first and second signals and for generating a reference value related to said calculated load current, said reference value representing a minimum performance for normal functioning of the circuit comprising said energy source, alternator, conductor, and load circuit, said calculating means also including means for comparing a value related to said first signal with said reference value; and
   warning means for producing a warning signal when the said value indicative of said first signal is lower than said reference value.

2. Monitoring apparatus as claimed in claim 1, wherein said calculating means includes means for repetitively generating said reference value and comparing said value indicative of said first signal with said reference value.

3. Monitoring apparatus as claimed in claim 1 or 2 wherein:
   said apparatus further comprises an analog-to-digital converter arranged to convert said first and second signals into first and second binary signals, respectively; and
   said calculating means is responsive to said first and second binary signals.

4. Monitoring apparatus as claimed in claim 1 wherein:
   said apparatus further comprises third detecting means for generating a third signal related to the ambient temperature in the proximity of said secondary energy source; and
   said calculating means further includes means for generating said reference value directly proportional to said load current, the constant of proportionality being related to said third signal.

5. A method of monitoring the instantaneous terminal voltage across a secondary energy source connected to an alternator drive by the prime engine of a vehicle and to an electric load circuit through a conductor, said method comprising the steps of:
   (a) generating a first signal related to the instantaneous terminal voltage across said energy source;
   (b) generating a second signal related to the instantaneous terminal voltage across said load circuit;
   (c) calculating a load current flowing through said load circuit using a resistance value of said conductor and the difference between said first and second signals;
   (d) generating a reference value related to said calculated load current; said reference value being representative of a minimum performance for normal functioning of the circuit comprising the energy source, alternator, conductor and load circuit;

(e) comparing a value indicative of said first signal with said reference value; and (f) producing a warning signal when said value indicative of said first signal is lower than the said reference value.

6. A method according to claim 5, wherein the steps (c), (d) and (e) are repeated continuously.

7. A method according to claim 5 or 6, further comprising the step of converting the first and second signals into first and second binary signals, respectively, said reference value generating step and said comparing step being responsive to said first and second binary signals.

8. A method according to claim 5, further comprising the steps of detecting ambient temperature in the proximity of the secondary energy source and producing a third signal indicative of the ambient temperature, said reference value being directly proportional to said load current, the constant of proportionality being related to said third signal.

9. Monitoring apparatus for use with a secondary energy source connected to an alternator driven by the prime engine of a vehicle and to an electric load circuit through a conductor, said apparatus comprising:

first detecting means for generating a first signal related to the instantaneous terminal voltage across said energy source;

second detecting means for generating a second signal related to the instantaneous terminal voltage across said load circuit;

signal generating means for selectively generating first and second travel mode signals, respectively indicative of first and second travel modes of the vehicle;

means responsive to said first and second electric signals and said first and second travel mode signals for selectively generating one of a first reference value and a second reference value, said first and second reference values being generated from first and second relationships, respectively, with the load current corresponding with the terminal voltage across said load circuit, said first and second reference values being generated when said first and second travel mode signals, respectively, are being generated, said reference values representing a minimum performance for normal functioning of the circuit comprising said energy source, alternator, conductor, and load circuit, said calculating means also including means for comparing a value related to said first signal with said reference values; and warning means for producing a warning signal when the said first signal is lower than said first reference value during said first travel mode and said second reference value during said second travel mode.

10. Monitoring apparatus for use with a secondary energy source as claimed in claim 9, wherein said apparatus further comprises third detecting means for generating a third signal related to the ambient temperature in the proximity of said secondary energy source; and said calculating means further includes means for generating said reference values directly proportional to said load current, the constant of proportionality being related to said third signal.

11. A method of monitoring the instantaneous terminal voltage across a secondary energy source connected to an alternator driven by the prime engine of a vehicle and to an electric load circuit through a conductor, said method comprising the steps of:

(a) generating a first signal related to the instantaneous terminal voltage across said energy source;

(b) generating a second signal related to the instantaneous terminal voltage across said load circuit;

(c) selectively generating first and second travel mode signals, respectively indicative of first and second travel modes of the vehicle;

(d) generating a first reference value in response to said first travel mode signal and a second reference value in response to said second travel mode signal, said first and second reference values being related to the load current corresponding with said terminal voltage across said load circuit by different functions, said first and second reference values being representative of a minimum performance for normal functioning of the circuit comprising the energy source, alternator, conductor and load circuit;

(e) comparing a value indicative of said first signal with the said reference value; and (f) producing a warning signal when the said value indicative of said first signal is lower than said first reference value during said first travel mode and said second reference value during said second travel mode.

12. Monitoring apparatus for use with a secondary energy source connected to an alternator driven by the prime engine of a vehicle and to an electric load circuit through a conductor, said apparatus comprising:

first detecting means for generating a first signal related to the instantaneous terminal voltage across said energy source;

second detecting means for generating a second signal related to the instantaneous terminal voltage across said load circuit;

means, responsive to said first and second electric signals, for calculating a load current across said conductor in consideration with a resistance value of said conductor and for generating a reference value related to said calculated load current based on a linear function $V_A = aI_L + V_1(T)$ where $V_A$ is said reference value, a is a negative constant indicative of a slope of the function, and $V_1(T)$ is an ordinate intercept of the function in consideration with the ambient temperature in the proximity of said second energy source, said reference value representing a minimum performance for normal functioning of the circuit comprising said energy source, alternator, conductor and load circuit, said calculating means also including means for comparing a value related to said first signal with said reference value; and warning means for producing a warning signal when the said value indicative of said first signal is lower than said reference value.

13. Monitoring apparatus as claimed in claim 12 wherein:

said apparatus further comprising a signal generating means for selectively generating first and second travel mode signals, respectively indicative of first and second travel modes of the vehicle;

said calculating means further includes means for selectively generating one of said reference values or another reference value, said another reference value being generated in a manner similar to the said reference value but from a different relationship with said load current, said reference value and said another reference value being generated when said first and second travel mode signals, respectively, are being generated; and said warning means produces a warning signal when the said value indicative of said first signal is lower than said reference value during said first travel mode and said another reference value during said second travel mode.

14. Monitoring apparatus as claimed in claim 1 or 12, wherein said warning means produces a warning signal when said calculated load current exceeds a maximum allowable current of said conductor.

* * * * *